United States Patent
Vathulya et al.

(10) Patent No.: US 6,747,307 B1
(45) Date of Patent: Jun. 8, 2004

(54) COMBINED TRANSISTOR-CAPACITOR STRUCTURE IN DEEP SUB-MICRON CMOS FOR POWER AMPLIFIERS

(75) Inventors: Vickram Vathulya, Ossining, NY (US); Tirdad Sowlati, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/542,711

(22) Filed: Apr. 4, 2000

(51) Int. Cl.[7] .............................................. H01L 27/108
(52) U.S. Cl. ........................ 257/307; 257/309; 257/381; 257/382; 257/401; 257/758
(58) Field of Search ......................... 257/299, 306–309, 257/381, 382, 401, 532, 756, 758, 211, 206; 330/250, 251; 438/396–399, 253–256

(56) References Cited

U.S. PATENT DOCUMENTS

| | | | |
|---|---|---|---|
| 4,617,193 A | * 10/1986 | Wu | 427/38 |
| 4,974,039 A | 11/1990 | Schindler et al. | 357/22 |
| 5,247,264 A | * 9/1993 | Cripe | 330/124 D |
| 5,583,359 A | 12/1996 | Ng et al. | 257/306 |
| 5,955,781 A | * 9/1999 | Joshi et al. | 257/712 |
| 6,025,259 A | * 2/2000 | Yu et al. | 438/618 |
| 6,137,155 A | * 10/2000 | Seshan et al. | 257/640 |
| 6,246,118 B1 | * 6/2001 | Buynoski | 257/758 |
| 6,265,778 B1 | * 7/2001 | Tottori | 257/758 |
| 6,268,779 B1 | * 7/2001 | van Zeijl | 331/117 |
| 6,274,934 B1 | * 8/2001 | Shirota | 257/758 |
| 6,278,187 B1 | * 8/2001 | Takata et al. | 257/758 |
| 6,333,255 B1 | * 12/2001 | Sekiguchi | 438/622 |

FOREIGN PATENT DOCUMENTS

JP 408236524 * 9/1996

OTHER PUBLICATIONS

"1.8GHz class E power amplifier for wireless communications" by T. Sowlati, Y. Greshishchev, C. Andre and T. Salama, in Electronics Letters, Sep. 26, 1996, vol. 32 No. 20, pp. 1846–1847.

"Idealized Operation of the Class E. Tuned Power Amplifier" by Frederick H. Raab, in Transactions on Circuits and Systems, vol. Cas–24, No. 12, Dec. 1977, pp. 725–735.

"A 1.9GHz 1W CMOS E Power Amplifier for Wireless Communications" by King–Chun Tsai and paul R. Gray, in ESSCIRC, Proceedings, Sep. '98, pp. 76–79.

* cited by examiner

*Primary Examiner*—Allan R. Wilson
*Assistant Examiner*—Paul E Brocks, II
(74) *Attorney, Agent, or Firm*—Peter Zawilski

(57) ABSTRACT

A combined transistor and capacitor structure comprising a transistor having alternating source and drain regions formed in a substrate of semiconductor material, and a capacitor formed over the transistor. The capacitor has at least first and second levels of electrically conductive parallel lines arranged in vertical rows, and at least one via connecting the first and second levels of lines in each of the rows, thereby forming a parallel array of vertical capacitor plates. A dielectric material is disposed between the vertical plates of the array. The vertical array of capacitor plates are electrically connected to the alternating source and drain regions of the transistor which form opposing nodes of the capacitor and electrically interdigitate the vertical array of capacitor plates.

11 Claims, 5 Drawing Sheets

COMBINED TRANSISTOR-CAPACITOR STRUCTURE IN DEEP SUB-MICRON CMOS FOR POWER AMPLIFIERS

RELATED APPLICATIONS

Commonly-assigned, copending U.S. patent application Ser. No. 09/545,785, entitled "Interdigitated Multilayer Capacitor For Deep Sub-Micron CMOS", filed Apr. 7, 2000.

Commonly-assigned, copending U.S. patent application Ser. No. 09/596,443, entitled "Multilayer Pillar Array Capacitor Structure For Deep Sub-Micron CMOS", filed Jun. 19, 2000.

Commonly-assigned, copending U.S. patent application Ser. No. 09/546,125, entitled "Multilayered Capacitor Structure With Alternately Connected Concentric Lines For Deep Sub-Micron CMOS", filed Apr. 10, 2000.

Commonly-assigned, copending U.S. patent application Ser. No. 09/542,712, entitled "Multilayer Capacitor Structure Having An Array of Concentric Ring-Shaped Plates For Deep Sub-Micron CMOS", filed Apr. 4, 2000.

FIELD OF THE INVENTION

This invention relates to transistors and capacitors in metal-oxide-semiconductor (MOS) structures, and in particular, a combined multi-finger power transistor and interdigitated multilayer (IM) capacitor structure in a deep sub-micron complementary MOS (CMOS) where the source and drain conductive lines are interconnected in multiple levels through vias to construct a parallel array of interdigitated vertical capacitor plates.

BACKGROUND OF THE INVENTION

Power transistors in Class E power amplifiers operate as switches, periodically turning on and off at a desired operating frequency. Such amplifiers require a parallel capacitance (Cp) at the transistor's output in order to shape the voltage and current waveforms. See F. Raab, "Idealized Operation of the Class E Tuned Power Amplifier", IEEE Trans. Circuits and Systems, Vol. CAS-24, No. 12, December 1977, pp. 725–735.

FIG. 1A illustrates a simplified cross-sectional view of a typical N-channel (NMOS) power transistor 10 in Class E power amplifiers. The transistor is a "multi-finger" device having a plurality of N+ regions 12 diffused into a P-semiconductor substrate 11, such as silicon, these regions 12 forming alternating source and drain regions. A gate oxide layer 13, formed of an insulative material such as silicon dioxide (in the case of a silicon substrate), lies between the N+ source and drain regions 12 on the substrate 11. The gate oxide layer 13 serves as insulation between a metal gate 14 and the substrate 11. Source and drain contacts 15 and conductive lines 16 facilitate electrical interconnection of the transistor 10 to other structures. FIG. 1B is a circuit diagram illustrating this power transistor.

Class E power amplifiers have been shown to be capable of operating in the 1–2 GHz range for Wireless applications. See T. Sowlati et al., "Low Voltage, High Efficiency Class E GaAs Power Amplifiers for Wireless Communications", IEEE. JSSC, October 1995, pp. 1074–1074; and T. Sowlati et al., "1.8 GHz Class E Power Amplifier for Wireless Communications", Electronics Letters, Vol. 32, No. 20, September 1996, pp. 1846–1846.

Recently, the use of Class E amplifiers has been reported in sub-micron CMOS technology. See K. Tsai et al., "1.9 GHz 1W CMOS Class E Power Amplifier for Wireless Communications", ESSCIRC, Proceedings, September 1998, pp. 76–79.

Providing a capacitance at the output of the power transistor in a Class E power amplifier is conventionally accomplished with a discrete and separate capacitor structure, wherein the parasitic capacitance associated with the transistor is extracted and counted as part of the capacitance. The capacitor is typically implemented with a conventional parallel plate capacitor structure.

The use of a separate capacitor structure has some disadvantages. In integrated circuit applications, a capacitor component undesirably enlarges the area of the circuit. Such area enlargements increase the cost of the circuit. Capacitors used in discrete/hybrid module applications, are provided "off-chip" and, therefore, must be wire-bonded to a discrete power transistor. For wireless applications in the GHz frequency range, the inductance of the wire-bonds cannot be ignored as it undesirably limits the functionality of the capacitor in shaping the voltage and current waveforms of the transistor.

Another disadvantage associated with the capacitors used conventional Class E amplifiers in sub-micron CMOS technology is that their conventional parallel plate structures are not scaleable. Therefore, as geometries scale down in deep sub-micron CMOS processes, the capacitance densities of these capacitors remain generally the same.

Interdigitated capacitors are used in microwave applications. These capacitors have closely placed, laterally interdigitated conductive line structures which generate fringing and cross-over capacitances. However, the cross-over capacitance produced by such capacitors is limited to a single conductor level.

Accordingly, there is a need for an improved capacitor structure for shaping the voltage and current waveforms of power transistors in deep sub-micron CMOS.

SUMMARY OF THE INVENTION

A combined transistor and capacitor structure comprising a transistor having alternating source and drain regions formed in a substrate of semiconductor material, and a capacitor formed over the transistor. The capacitor has at least first and second levels of electrically conductive parallel lines arranged in vertical rows, and at least one via connecting the first and second levels of lines in each of the rows, thereby forming a parallel array of vertical capacitor plates. A dielectric material is disposed between the vertical plates of the array. The vertical array of capacitor plates are electrically connected to the alternating source and drain regions of the transistor which form opposing nodes of the capacitor and electrically interdigitate the vertical array of capacitor plates.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that the drawings are for purposes of illustrating the concepts of the invention and are not to scale.

DETAILED DESCRIPTION OF THE INVENTION

Figure 1A:
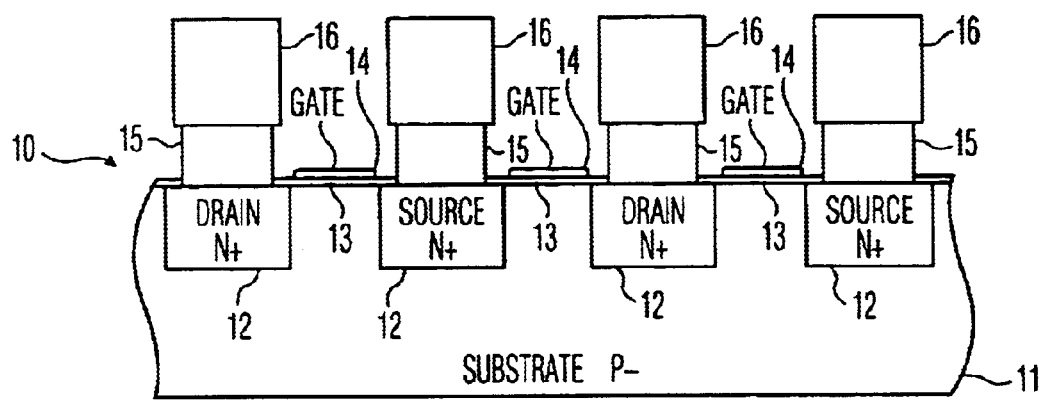
FIG. 1A is a sectional view of a conventional power transistor in a deep sub-micron CMOS structure.
Figure 1B:
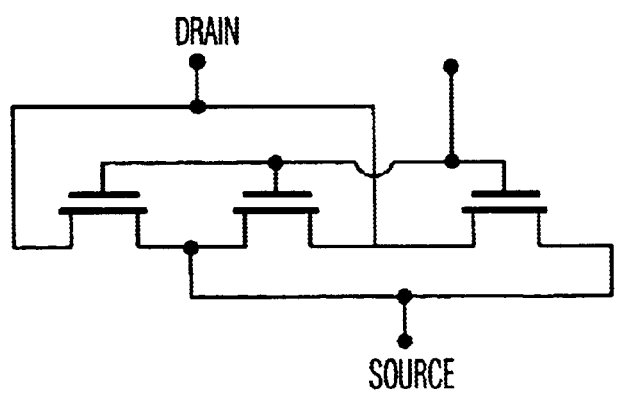
FIG. 1B is a circuit diagram illustrating the power transistor of FIG. 1A.
Figure 2:
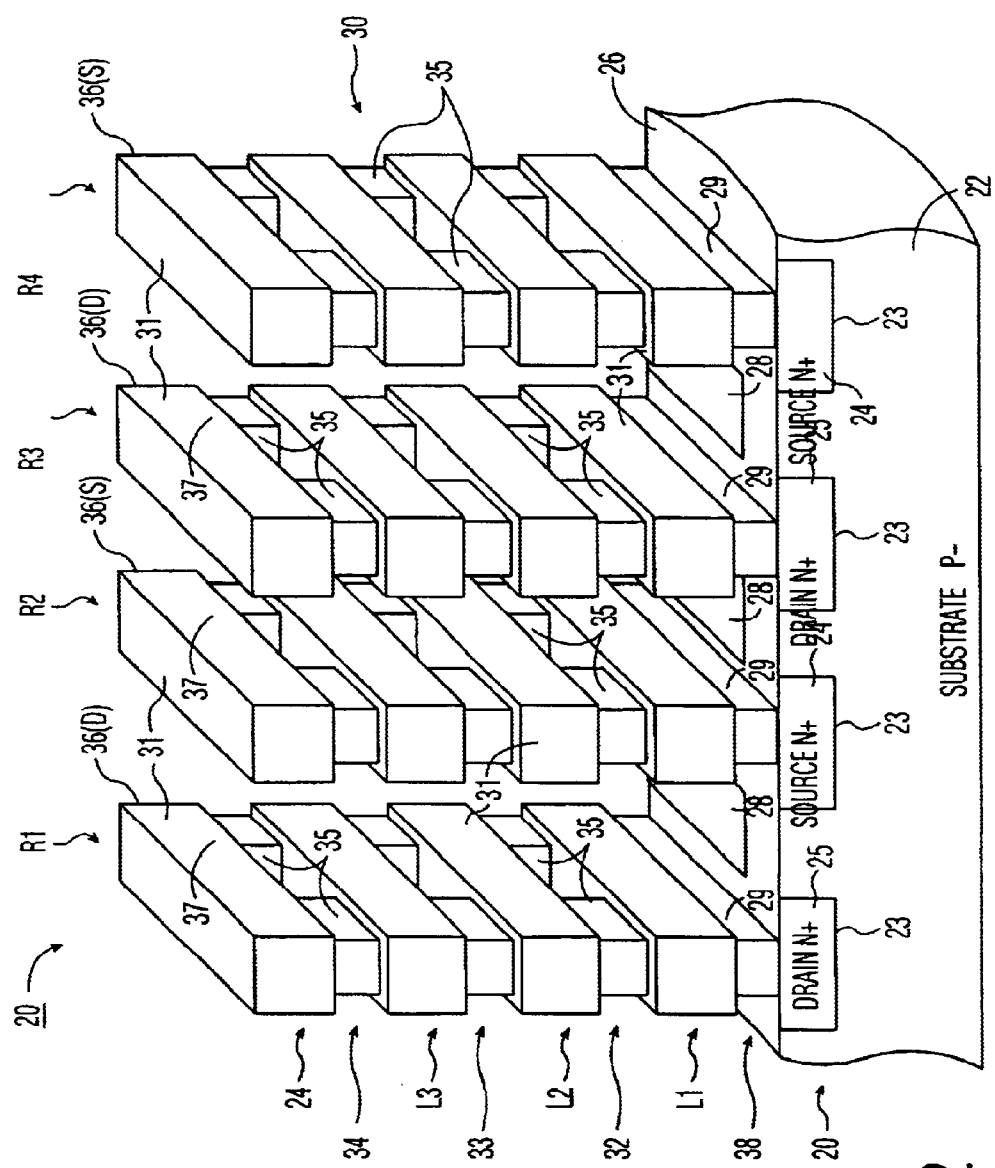
FIG. 2 is a perspective view of a combined power transistor and capacitor in a deep sub-micron CMOS structure according to the invention.
Figure 3:
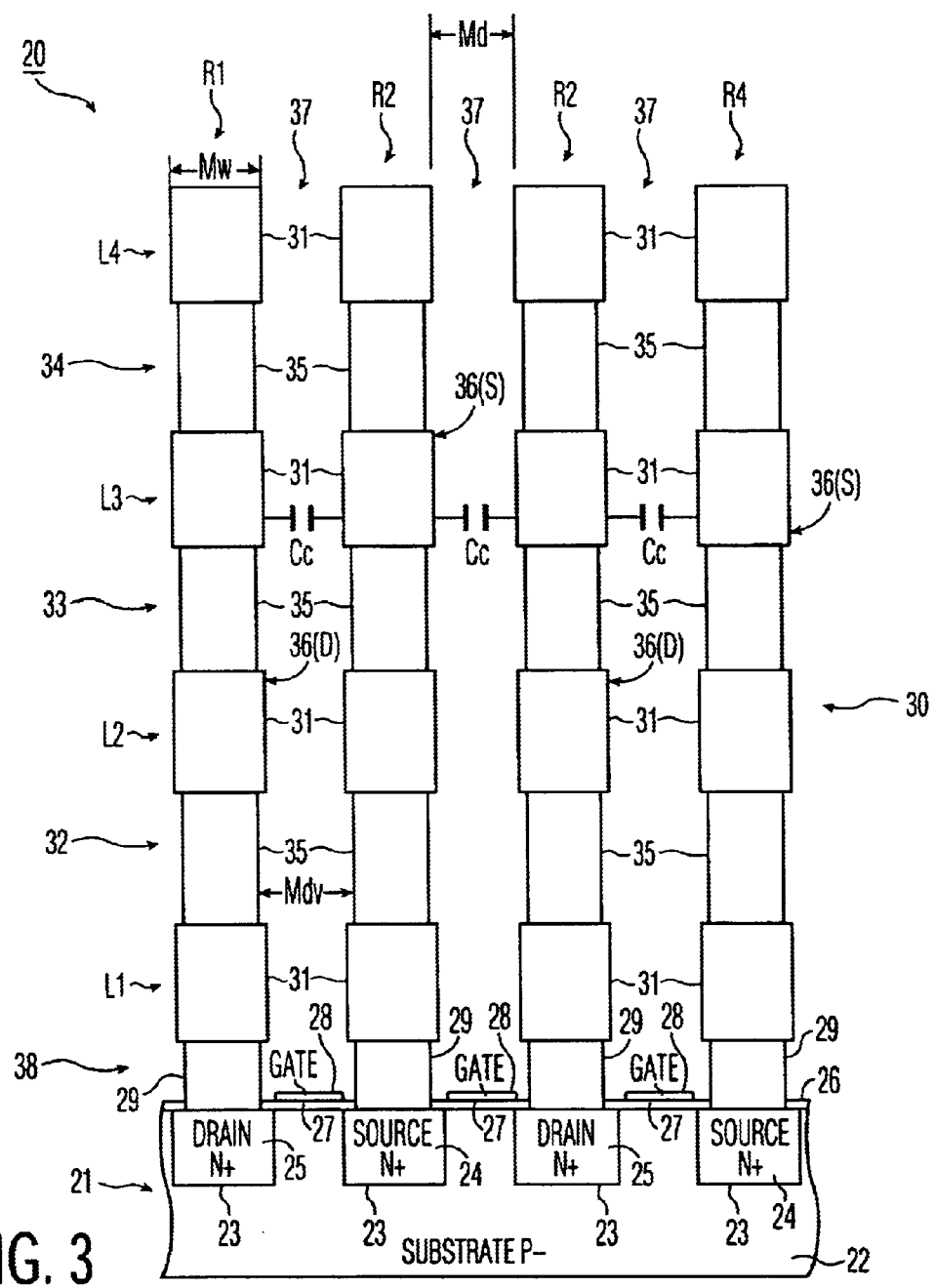
FIG. 3 is an end view of the combined power transistor and capacitor of FIG. 2.

FIGS. 2 and 3 collectively illustrate a combined power transistor and capacitor configuration 20 in a deep sub-micron CMOS structure according to an embodiment of the invention. The combined power transistor and capacitor configuration 20 is especially intended for use as a Class E amplifier in sub-micron CMOS. It should be understood however, that the combined power transistor and capacitor configuration 20 may also be useful in other classes of amplifiers. For example, the combined power transistor and capacitor configuration 20 may be useful as a harmonic resonance unit.

Still referring to FIGS. 2 and 3, the transistor 21 of the combination 20 is a "multi-finger" NMOS device having a plurality of N+regions 23 (only four are shown for ease of illustration) diffused into a P-semiconductor substrate 11, made from silicon or any other suitable semiconductor material. The N+ regions 23 form alternating source and drain regions 24, 25. A layer 26 of insulative material such as silicon dioxide (in the case of the silicon substrate) covers the substrate 22 above the source and drain regions 24, 25. The portions of the insulative layer 26 lying between the N+ source and drain regions 24, 25 form gate oxide layers 27. A gate layer 28 of metal or polysilicon is formed on each gate oxide layer 27. Source and drain contacts 29 extend through two insulative layers 38, 26 to the N+ source and drain regions 24, 25.

The capacitor 30 of the combination 20 is formed using source and drain conductive lines of the transistor 21 arranged in an interdigitated multilayer (IM) capacitor structure similar to the one described in co-pending U.S. patent application Ser. No. 09/545,785, entitled "Interdigitated Multilayer Capacitor Structure For Deep Sub-Micron CMOS." In particular, the capacitor 30 includes two or more conductor levels (four conductor levels L1–L4 are shown for illustrative purposes only) of electrically conductive source and drain lines 31 arranged in a horizontal parallel array, formed respectively on the source and drain contacts 29. A first layer 32 of dielectric material fills the space between the first and second conductor levels L1, L2 and the spaces between the lines 31 of the first level L1, a second dielectric layer 33 fills the space between the second and third conductor levels L2, L3 and the spaces between the lines 31 of the second level L2, and a third dielectric layer 34 fills the space between the third and fourth conductor levels L3, L4 and the spaces between the lines 31 of the third level L3. A fourth dielectric layer 37 fills the spaces between the lines 31 of the fourth level L4.

The multiple levels L1–L4 of conductive lines 31 are aligned over the source and drain contacts 29 in vertical in rows or stacks R1–R4. The conductive lines 31 in each row are electrically interconnected through vertically extending electrically conductive vias 35 formed in the first, second, and third dielectric layers 32, 33, 34. The rows R1–R4 of conductive lines 31 and vias 35 form a parallel array of vertically extending plates 36 which form the electrodes of the capacitor 30. The vertical plates 36 are electrically interdigitated into "S" and "D" plates by their connection to the source and drain regions 24, 25 of the transistor 21, which form the terminals of the capacitor 30.

The mechanism by which the capacitor 30 of the transistor and capacitor combination 20 generates capacitance is explained in detail in the earlier mentioned U.S. Patent Application Briefly, the capacitor 30 has a total capacitance $C_{Total}$ which is the sum of all the cross-over capacitance $C_c$ and all the fringing capacitance $C_f$ between the interdigitated vertical plates 36. The cross-over capacitance $C_c$ is the dominant factor in the total capacitance $C_{Total}$ of this capacitor structure, especially as the number of conductor levels in the capacitor increases. The fringing capacitance $C_f$ in this capacitor structure generally becomes much less significant as the number of conductor levels increases.

Figure 4:
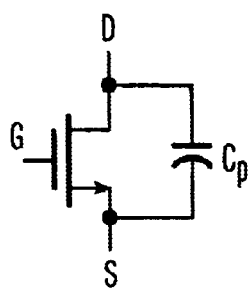
FIG. 4 is a circuit diagram illustrating the combined power transistor and capacitor of the invention.

FIG. 4 is a circuit diagram of the combined power transistor and capacitor 20 of the invention. The capacitance provided by the capacitor 30 of the transistor and capacitor combination 20 can be easily calculated using the capacitance per unit length given for the cross-coupling capacitance $C_c$. By varying the number of conductor levels and vias, the cross-coupling capacitance $C_c$ between the vertical plates 36 can be easily increased or decreased without affecting the size of the power transistor 21. Hence, the capacitance of the capacitor 30 can be adjusted to the desired value needed for shaping the voltage and current waveforms of the transistor. For example, in a 0.25 CMOS process, the capacitor 30 of the combination 20 with a total area of 8 mm, can have a capacitance range of about 1 pF to 4 pF.

Figure 5A:
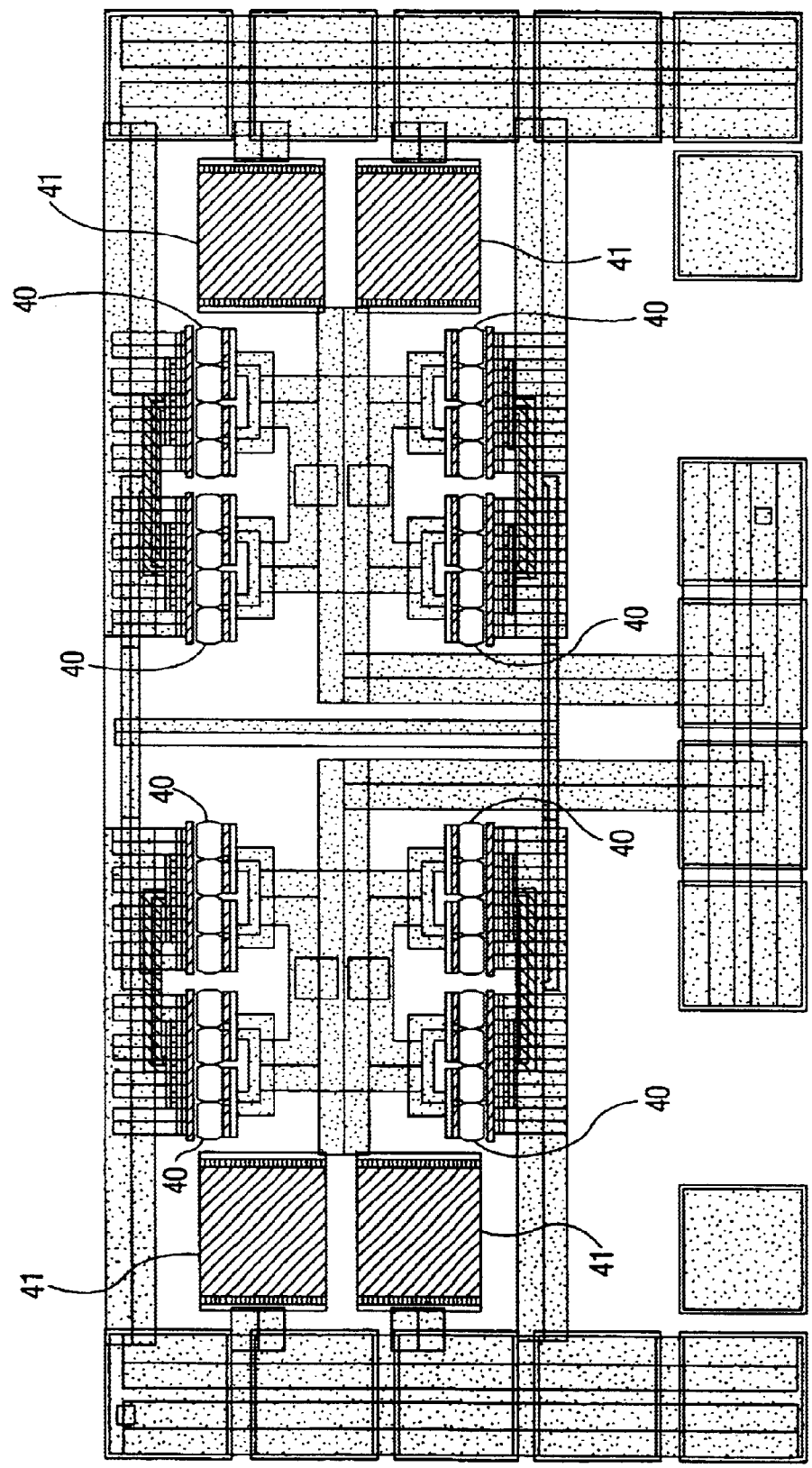
FIG. 5A is a plan view of a layout in 0.25 micron CMOS of a conventional power transistor and associated parallel plate capacitors.
Figure 5B:
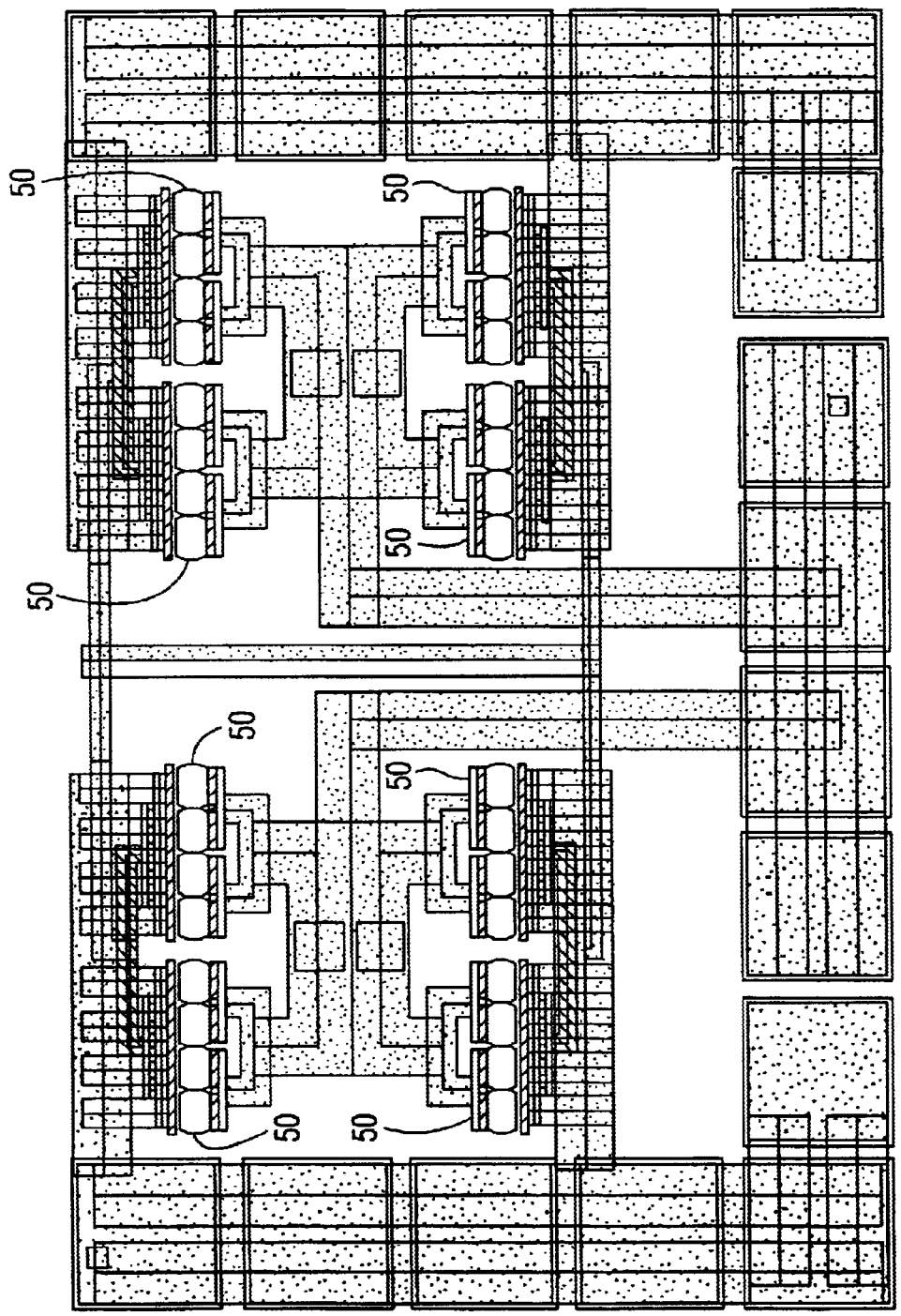
FIG. 5B is a plan view of a layout in 0.25 micron CMOS of the combined power transistor and capacitor of the invention.

The combined power transistor and capacitor of the invention advantageously provides a substantial area reduction on the substrate. This is because the total area consumed on the substrate is substantially equal to the area of the transistor only. No additional area is required for the capacitor. This area reduction can be seen by comparing the layout in 0.25 micron CMOS of a plurality of conventional power transistors 40 and their associated parallel plate capacitors 41 shown in FIG. 5A, with the layout in 0.25 micron CMOS of a plurality of combined power transistor and capacitor structures 50 of the invention shown in FIG. 5B. As can be seen, the combined power transistor and capacitor structures 50 of the invention consumes about 30 percent less area on the substrate than the conventional power transistors 40 and their associated separate capacitors 41.

In integrated circuit applications, the use of the combined power transistor and capacitor of the invention with its area reduction, translates into a cost saving. This is because the size of the IC semiconductor substrate can be reduced.

The use of the combined power transistor and capacitor of the invention in discrete/hybrid module applications, eliminates the wire-bond connection associated with conventional power transistors and their off-chip capacitors. Moreover, in wireless applications in the GHz range, the combined transistor and capacitor of the invention provides improved performance as the inductance of the wire-bonds of conventional power transistor and off-chip capacitor layouts limit the functionality of the capacitor in shaping the voltage and current waveforms.

An additional advantage of the combined power transistor and capacitor of the invention is that it is has an increased immunity against electromigration effects. This is due to placement of the multi conductor level stack on the source and drain fingers.

The combined transistor and capacitor of the invention can be manufactured using conventional deep sub-micron CMOS processing. In present state-of-the-art deep sub-micron CMOS technology, conductive line spacings of about 0.5 microns or less is common. Thus, the minimum distance between the vertical plates 36 of the capacitor 30 is typically equal to or less than about 0.5 microns. These sub-micron spacings between the vertical plates 36 of the capacitor 30 provide it with an excellent capacitance density. As geometries continue to scale down, the capacitance density of the capacitor 30 will increase due to the decrease in the minimum width $M_w$ of the conductive lines 31, the dimensions of the vias 35 and the minimum distance $M_{dv}$ between the vias 35 in the same level, and the minimum distance $M_d$ between vertical plates 36.

While the foregoing invention has been described with reference to the above embodiment, additional modifications and changes can be made without departing from the spirit of the invention. Accordingly, all such modifications and changes are considered to be within the scope of the appended claims.

What is claimed is:

1. A combined transistor and capacitor structure comprising:
   a transistor having a plurality of alternating source and drain regions formed in a substrate of semiconductor material; and
   a capacitor formed over the transistor, the capacitor having:
      at least first and second levels of electrically conductive parallel lines, the lines of the levels arranged in vertical rows, the lines in each of the rows being substantially parallel;
      at least one via connecting the first and second levels of lines in each of the rows thereby forming a parallel array of vertical capacitor plates; and
      a dielectric material disposed between the vertical plates of the array;
   wherein the vertical array of capacitor plates are electrically connected to the plurality of alternating source and drain regions of the transistor, the source and drain regions forming opposing nodes of the capacitor, thereby electrically interdigitating the vertical array of capacitor plates.

2. The combined transistor and capacitor structure of claim 1, wherein the conductive lines comprise metal.

3. The combined transistor and capacitor structure of claim 1, wherein the conductive lines comprises polysilicon.

4. The combined transistor and capacitor structure of claim 1, wherein the dielectric material-comprises silicon dioxide.

5. The combined transistor and capacitor structure of claim 1, further comprising:
   at least a third level of electrically conductive lines disposed over the second level of lines in manner which extends the rows vertically; and
   at least one via connecting the second and third level lines in each of the rows so that the third level of lines vertically extends the parallel array of vertical capacitor plates.

6. The combined transistor and capacitor structure according to claim 1, wherein the transistor further includes:
   a plurality of insulated gate structures disposed on the substrate between the source and drain regions;
   a plurality of source and drain contacts electrically connecting the source and drain regions to the capacitor plates.

7. The combined transistor and capacitor structure according to claim 1, wherein the transistor is a power transistor.

8. The combined transistor and capacitor structure according to claim 1, wherein the transistor forms a power transistor of a Class E power amplifier in a sub-micron CMOS structure.

9. The combined transistor and capacitor structure according to claim 1, wherein the at least first and second levels of electrically conductive parallel lines comprise multiple levels of electrically conductive lines arranged in vertical rows, the lines in each of the rows being substantially parallel; and the at least one via comprises a plurality of vias connecting the lines in each of the rows thereby forming a parallel array of vertical capacitor plates.

10. The combined transistor and capacitor structure according to claim 9, wherein the transistor further includes:
   a plurality of insulated gate structures disposed on the substrate between the source and drain regions;
   a plurality of source and drain contacts electrically connecting the source and drain regions to the capacitor plates.

11. A combined transistor and capacitor structure comprising:
   a transistor having a source region and a drain region formed in a substrate of semiconductor material; and
   a capacitor formed over the transistor, the capacitor having:
      at least first and second levels of electrically conductive lines, the lines of the levels arranged in at least two vertical rows, the lines in each of the rows being substantially parallel;
      at least one via connecting the first and second levels of lines in each of the rows thereby forming at least two parallel vertical capacitor plates; and
      a dielectric material disposed between the vertical plates;
   wherein one of the at least two capacitor plates is electrically connected to the source region of the transistor and other one of the at least two capacitor plates is electrically connected to the drain region of the transistor, the source and drain regions forming opposing nodes of the capacitor.

* * * * *